(12) United States Patent
Takami

(10) Patent No.: US 7,488,652 B2
(45) Date of Patent: Feb. 10, 2009

(54) MANUFACTURING METHOD OF GATE OXIDATION FILMS

(75) Inventor: Syuusei Takami, Yusui-cho (JP)

(73) Assignee: Yamaha Corporation, Shizuoka-Ken (JP)

(*) Notice: Subject to any disclaimer, the term of this patent is extended or adjusted under 35 U.S.C. 154(b) by 272 days.

(21) Appl. No.: 11/148,362

(22) Filed: Jun. 9, 2005

(65) Prior Publication Data

US 2005/0277259 A1    Dec. 15, 2005

(30) Foreign Application Priority Data

Jun. 9, 2004  (JP) ............... 2004-170905
Mar. 16, 2005 (JP) ............... 2005-074489

(51) Int. Cl.
H01L 21/8236 (2006.01)
H01L 21/31 (2006.01)

(52) U.S. Cl. .............. 438/276; 438/275; 438/510; 438/770; 257/E21.285; 257/E21.335

(58) Field of Classification Search .......... 438/275, 438/276, 510, 770
See application file for complete search history.

(56) References Cited

U.S. PATENT DOCUMENTS 5,918,116 A   6/1999  Chittipeddi
6,358,819 B1  3/2002  Shelton et al.
6,541,393 B2* 4/2003  Sugizaki et al. ............ 438/763

FOREIGN PATENT DOCUMENTS

| DE | 30 32 608 A1 | 3/1981 |
| JP | H08-162618 | 6/1996 |
| JP | 2000-195968 | 7/2000 |
| JP | 2001-156260 | 6/2001 |
| TW | 413863 | 12/2000 |

\* cited by examiner

Primary Examiner—Alexander G Ghyka
(74) Attorney, Agent, or Firm—Dickstein Shapiro LLP

(57) ABSTRACT

After forming a field insulating film 12 on a substrate, sacrificing or gate oxidation films are formed as oxidation films 14a and 14b. An ion implantation layer 18 is formed by one or plurality of implantation process of argon (or fluoride) ion in an element hole 12a using a resist layer 16 as a mask via the oxidation film 14a. When the oxidation films 14a and 14b are used as sacrificing oxidation films, gate oxidation films are formed in the element holes 12a and 12b after removing the resist film 16 and the oxidation films 14a and 14b. When the oxidation films 14a and 14b are used as gate oxidation films, the oxidation films are once thinned by etching and then thickened after removing the resist layer 16. The gate oxidation film 14a is thicker than the gate oxidation film 14b by forming the ion implantation layer 18.

11 Claims, 15 Drawing Sheets

MANUFACTURING METHOD OF GATE OXIDATION FILMS

CROSS REFERENCE TO RELATED APPLICATION

This application is based on Japanese Patent Application 2004-170905, filed on Jun. 9, 2004, and Japanese Patent Application 2005-074489, filed on Mar. 16, 2005, the entire contents of which are incorporated herein by reference.

BACKGROUND OF THE INVENTION

A) Field of the Invention

This invention relates to a manufacturing method of gate oxidation films that is adequate for being used in manufacturing a MOS-type IC, etc., and more specifically relates to a manufacturing method of a plurality of gate oxidation films having different thickness from each other formed at one thermal oxidation process.

B) Description of the Related Art

It is well known conventionally that a plurality of MOS-type transistors having different thickness from each other are formed on a semiconductor substrate when a MOS-type IC, etc. is manufactured. In addition to that, relating to that technique, various types of methods have been suggested for forming a plurality of gate oxidation films having different thickness from each other formed at one thermal oxidation process. FIG. 16 to FIG. 18 show one example of the method of forming gate oxidation films. The entire contents of Japanese Laid-open Patent 2000-195968 are herein incorporated by reference for detail of the method of forming gate oxidation films.

In a process shown in FIG. 16, a field insulating film 2 made of a silicon oxidation film is formed on one main surface of a silicon substrate 1 by a selecting oxidation process. Thereafter, sacrificing films 3a and 3b made of silicon oxidation films are formed respectively on surfaces inside element holes 2a and 2b of the insulating film 2 by a thermal oxidation process. Thickness of the oxidation films 3a and 3b are both at about 15 nm.

Next, on the surface of the substrate, a resist layer 4 having a hole 4a corresponding to the element hole 2a is formed by a photolithography process. An ion implantation layer 5 is formed on the surface of the element hole 2a with the resist layer 4 as a mask and via the oxidation film 3a by implanting argon (Ar) ion. An accelerating voltage at this time is about 15 keV. In the ion implantation layer 5, an oxidation velocity of silicon will be increased because crystallinity of the silicon is destructed by the ion implantation.

In a process shown in FIG. 17, after removing the resist layer 4 by a chemical treatment, etc., the oxidation films 3a and 3b are removed by a hydrogen fluoride treatment. The hydrogen fluoride treatment is executed under a condition for removing an oxidation film with thickness of 30 nm when the thickness of the oxidation films 3a and 3b are 15 nm. Therefore, the insulating film 2 also becomes thinner slightly. Thereafter, a cleaning process such as RCA cleaning having etching effect is executed to the surface of the silicon substrate 1 as a proceeding process for a thermal process.

In a process shown in FIG. 18, oxidation films 6a and 6b formed of silicon oxidation films are formed on the surfaces inside the element holes 2a and 2b by the thermal process. By executing the thermal process under a condition for making thickness of the gate oxidation film 50 nm, a silicon oxidation film with thickness of 80-100 nm can be obtained as the gate oxidation film 6a because the oxidation velocity of the silicon has been accelerated near the silicon surface inside the element hole 2a by the ion implantation layer 5. Then, a first and a second MOS-type transistors respectively with the oxidation films 6a and 6b as gate insulating films are formed inside the element holes 2a and 2b by a normal silicon gate process, etc.

According to the above-described prior art, productivity is increased by forming the gate oxidation films 6a and 6b having different thickness by one thermal oxidation process, and high reliability can be achieved by avoiding pollution of the silicon surface because the surface of the silicon is covered by the sacrificing oxidation films 3a and 3b at the time of forming and removing the resist layer 4.

However, the implantation of the Ar ion is executed via the sacrificing oxidation film 3a at a low acceleration voltage such as about 15 keV, and therefore, the ion implantation layer 5 is formed in shallow region near the surface of the silicon because the range of implanting ion is about 17.1 nm. Therefore, in the process shown in FIG. 17 when the cleaning process such as the RCA cleaning having etching effect is executed as a proceeding process of the thermal oxidation process after the removal of the sacrificing oxidation films 3a and 3b, the surface part of the ion implantation layer 5 having the highest ion density is removed by the etching. When the thermal process in FIG. 18 is executed thereafter, the ion density in the ion implantation layer 5 is further lowered by out-diffusion. Therefore, oxidation efficiency in the element hole 2a will be decreased, and it makes difficult to obtain the oxidation film 6a having enough thickness compared to the oxidation film 6b.

SUMMARY OF THE INVENTION

It is an object of the present invention to provide a manufacturing method of gate oxidation films that is capable of executing thick gate oxidation efficiently when a plurality of gate oxidation films having different thickness are formed by one thermal oxidation process.

According to one aspect of the present invention, there is provided a method of manufacturing gate oxidation films, comprising the steps of: (a) preparing a semiconductor substrate; (b) forming a field insulating film having a first and a second element holes on one main surface of the semiconductor substrate; (c) forming a first and a second sacrificing oxidation films respectively on semiconductor surfaces inside the first and the second element holes by a first thermal oxidation process; (d) forming a resist layer exposing the first element hole and covering the second element hole on the field insulating film (e) forming an ion implantation layer by implanting argon ion in to a semiconductor part inside the first element hole via the first sacrificing oxidation film with the resist layer as a mask under a condition of accelerating voltage at 20 to 50 keV and a dose amount of $1\times10^{14}$ to $2\times10^{16}$ ions/cm$^2$; (f) removing the resist layer after forming the ion implantation layer; (g) removing the first and the second sacrificing oxidation films after removing the resist layer; and (h) forming a first and a second gate oxidation films on semiconductor surfaces respectively in the first and the second element holes by a second thermal process after removing the first and the second sacrificing oxidation films, wherein the first gate oxidation film is formed to be thicker than the second gate oxidation film by accelerated oxidation based on the ion implantation layer.

According to the present invention, the argon ion is implanted at accelerating voltage of 20-50 keV with dose of $1\times10^{14}$ to $2\times10^{16}$ ions/cm$^2$ at the ion implantation step (e); therefore, the ion implantation layer is formed comparatively deeper region from the surface of the silicon substrate. By that, when the cleaning having the etching effect is performed as a proceeding process of the second thermal process, the ion implantation layer will not be removed by the etching effect because a part having the highest impurity density is formed comparatively deeper region from the surface of the silicon substrate. Thereafter, when the second thermal oxidation process shown is executed, the implanted ion is slight diffused to an out direction near the semiconductor surface; however, the ion in the comparatively deeper region from the surface of the silicon is hardly diffused and decrease in the ion density as a whole is a little. Therefore, the oxidation efficiency in the first element hole is improved, and the first gate oxidation film can be thicker enough than the second gate oxidation film by the short-time process.

Recently, argon is used instead of hydrogen for manufacturing a wafer having denuded zone (DZ). Because the second thermal oxidation process is executed after forming the argon ion implantation layer in the relatively deep region from the semiconductor surface in the above-described method of manufacturing gate oxidation films, density of oxygen, which causes defection, is decreased in the surface of the substrate (wafer) by out-diffusion, and micro defections capturing harmful heavy metal, etc. in the inner region of the substrate is grown; therefore, the substrate surface will be converted to DZ. Therefore, high quality MOS-type transistor using the first gate oxidation film as a gate insulating film can be formed in the DZ on the substrate surface.

According to another aspect of the present invention, there is provided a method of manufacturing gate oxidation films, comprising the steps of: (a) preparing a semiconductor substrate; (b) forming a field insulating film having a first and a second element holes on one main surface of the semiconductor substrate; (c) forming a first and a second sacrificing oxidation films respectively on semiconductor surfaces inside the first and the second element holes by a first thermal oxidation process; (d) forming a resist layer exposing the first element hole and covering the second element hole on the field insulating film; (e) forming an ion implantation layer by implanting fluoride ion in to a semiconductor part inside the first element hole via the first sacrificing oxidation film with the resist layer as a mask under a condition of accelerating voltage at 15 to 25 keV and a dose amount of $6 \times 10^{14}$ to $1 \times 10^{15}$ ions/cm$^2$; (f) removing the resist layer after forming the ion implantation layer; (g) removing the first and the second sacrificing oxidation films after removing the resist layer; and (h) forming a first and a second gate oxidation films on semiconductor surfaces respectively in the first and the second element holes by a second thermal process after removing the first and the second sacrificing oxidation films, wherein the first gate oxidation film is formed to be thicker than the second gate oxidation film by accelerated oxidation based on the ion implantation layer.

According to the present invention, the fluoride ion is implanted at accelerating voltage of 15-25 keV with dose of $6 \times 10^{14}$ to $1 \times 10^{15}$ ions/cm$^2$ at the ion implantation step (e); therefore, the ion implantation layer is formed comparatively deeper region from the surface of the silicon substrate. Therefore, the oxidation efficiency in the first element hole is improved, and the first gate oxidation film can be thicker enough than the second gate oxidation film by the short-time process.

Moreover, it has been reported that the fluoride can improve a quality of an oxidation film in addition to increasing the oxidation velocity. In the above-described method of manufacturing gate oxidation films, fluoride is taken into the first gate oxidation film during the second thermal oxidation process; therefore, hot carrier tolerance and insulating resistance capacity of the first gate oxidation film will be improved.

Moreover, it has been reported that the fluoride can restrain diffusion of conductive type defining impurities such as boron, phosphorus, etc in silicon. The most severe short-channel effect causing a property of the MOS-type transistor appears in the deepest region of the gate of the source and drain regions. In the above-described method of manufacturing gate oxidation films, the fluoride ion implantation layer is formed in relatively deep region; therefore, a property of the MOS-type transistor can be stabilized because diffusion of impurities such as boron, phosphorus, etc. in the source and drain regions in various thermal processes after the formation of the source and drain regions.

According to further aspect of the present invention, there is provided a method of manufacturing gate oxidation films, comprising the steps of: (a) preparing a semiconductor substrate; (b) forming a field insulating film having a first and a second element holes on one main surface of the semiconductor substrate; (c) forming a first and a second gate oxidation films respectively on semiconductor surfaces inside the first and the second element holes by a first thermal oxidation process; (d) forming a resist layer exposing the first element hole and covering the second element hole on the field insulating film; (e) forming an ion implantation layer by implanting an impurity ion that increases oxidation velocity but does not define a conductive type to a semiconductor part inside the first element hole via the first gate oxidation film with the resist layer as a mask; (f) removing the resist layer after forming the ion implantation layer; (g) thinning the first and the second gate oxidation films by an etching process after removing the resist layer; and (h) thickening the first and the second gate oxidation films by a second thermal process after thinning the first and the second gate oxidation films, wherein the first gate oxidation film is thickened more than the second gate oxidation film by accelerated oxidation based on the ion implantation layer.

After the formation of the ion implantation layer by implanting impurities that increases oxidation velocity but does not define conductive type such as argon or fluoride, etc. to the semiconductor part of the first element hole via the first gate oxidation film, the first and the second gate oxidation films are thinned by the etching process. Thereafter, in the second thermal oxidation process, the first gate oxidation film is thickened more than the second gate oxidation film by the accelerated oxidation based on the ion implantation. The second thermal oxidation process is executed in a condition that the first gate oxidation film covers the ion implantation layer; therefore, the first gate oxidation film restrains out-diffusion of the implanted ion, and the oxidation efficiency inside the first element hole is improved. Therefore, the thickness of the first gate oxidation film can be thicker than that of the second gate oxidation film in a short time.

Moreover, the ion implanting step (e) may implant argon ion as the impurity ion under a condition of accelerating voltage at 20 to 50 keV and a dose amount of $1 \times 10^{14}$ to $2 \times 10^{16}$ ions/cm$^2$. In this case, the DZ can be formed on the substrate surface.

Furthermore, the ion implanting step (e) may implant fluoride ion as the impurity ion under a condition of accelerating voltage at 15 to 25 keV and a dose amount of $6 \times 10^{14}$ to $1 \times 10^{15}$ ions/cm$^2$. In this case, a property of the transistor can be stabilized and hot carrier tolerance and insulating resistance capacity of the first gate oxidation film will be improved.

According to still another aspect of the present invention, there is provided a method of manufacturing gate oxidation films, comprising the steps of: (a) preparing a semiconductor substrate; (b) forming a field insulating film having a first and a second element holes on one main surface of the semiconductor substrate; (c) forming a first and a second sacrificing oxidation films respectively on semiconductor surfaces inside the first and the second element holes by a first thermal oxidation process; (d) forming a resist layer exposing the first element hole and covering the second element hole on the field insulating film; (e) forming a plurality of ion implantation layers by a plurality of ion implantation, each implanting an impurity ion that increases oxidation velocity but does not define a conductive type to a semiconductor part inside the first element hole via the first sacrificing oxidation film with the resist layer as a mask at accelerating voltage different from one another; (f) removing the resist layer after forming the ion implantation layers; (g) removing the first and the second sacrificing oxidation films after removing the resist layer; and (h) forming a first and a second gate oxidation films on semiconductor surfaces respectively in the first and the second element holes by a second thermal process after removing the first and the second sacrificing oxidation films, wherein the first gate oxidation film is formed to be thicker than the second gate oxidation film by accelerated oxidation based on the ion implantation layer.

Moreover, the ion implanting step (e) implants argon ion as the impurity ion by two steps wherein a first step is executed under a condition of accelerating voltage at 50 to 100 keV and a dose amount of $5 \times 10^{13}$ to $5 \times 10^{15}$ ions/cm$^2$, and a second step is executed under a condition of accelerating voltage at 10 to 40 keV and a dose amount of $5 \times 10^{13}$ to $5 \times 10^{15}$ ions/cm$^2$. Furthermore, the ion implanting step (e) implants fluoride ion as the impurity ion by two steps wherein a first step is executed under a condition of accelerating voltage at 30 to 60 keV and a dose amount of $5 \times 10^{13}$ to $5 \times 10^{15}$ ions/cm$^2$, and a second step is executed under a condition of accelerating voltage at 10 to 25 keV and a dose amount of $5 \times 10^{13}$ to $5 \times 10^{15}$ ions/cm$^2$.

The plurality of the ion implantation layers are formed in the different depth by implanting the impurity ion that increases oxidation velocity but does not define a conductive type such as the argon or the fluoride ion to a semiconductor part inside the first element hole via the first sacrificing oxidation film with the resist layer as a mask; therefore, the implanted ion density distribution in a depth direction is uniformed by the ion implantation layers. Therefore, the oxidation efficiency is further improved comparing to the one-step implantation, and the thick first gate oxidation film can be formed in further short time. Moreover, an amount of impurity (argon or fluoride) taken into the first gate oxidation film will be fixed, and a film quality of the first gate oxidation film will be stabilized.

According to still another aspect of the present invention, there is provided a method of manufacturing gate oxidation films, comprising the steps of: (a) preparing a semiconductor substrate; (b) forming a field insulating film having a first and a second element holes on one main surface of the semiconductor substrate; (c) forming a first and a second gate oxidation films respectively on semiconductor surfaces inside the first and the second element holes by a first thermal oxidation process; (d) forming a resist layer exposing the first element hole and covering the second element hole on the field insulating film; (e) forming a plurality of ion implantation layers by a plurality of ion implantation, each implanting an impurity ion that increases oxidation velocity but does not define a conductive type to a semiconductor part inside the first element hole via the first gate oxidation film with the resist layer as a mask at accelerating voltage different from one another; (f) removing the resist layer after forming the ion implantation layers; (g) thinning the first and the second gate oxidation films by an etching process after removing the resist layer; and (h) thickening the first and the second gate oxidation films by a second thermal process after thinning the first and the second gate oxidation films, wherein the first gate oxidation film is thickened more than the second gate oxidation film by accelerated oxidation based on the ion implantation layer.

Moreover, the ion implanting step (e) implants argon ion as the impurity ion by two steps wherein a first step is executed under a condition of accelerating voltage at 50 to 100 keV and a dose amount of $5 \times 10^{13}$ to $5 \times 10^{15}$ ions/cm$^2$, and a second step is executed under a condition of accelerating voltage at 10 to 40 keV and a dose amount of $5 \times 10^{13}$ to $5 \times 10^{15}$ ions/cm$^2$. Furthermore, the ion implanting step (e) implants fluoride ion as the impurity ion by two steps wherein a first step is executed under a condition of accelerating voltage at 30 to 60 keV and a dose amount of $5 \times 10^{13}$ to $5 \times 10^{15}$ ions/cm$^2$, and a second step is executed under a condition of accelerating voltage at 10 to 25 keV and a dose amount of $5 \times 10^{13}$ to $5 \times 10^{15}$ ions/cm$^2$.

The plurality of the ion implantation layers are formed in the different depth by implanting the impurity ion that increases oxidation velocity but does not define a conductive type such as the argon or the fluoride ion to a semiconductor part inside the first element hole via the first gate oxidation film with the resist layer as a mask; therefore, the implanted ion density distribution in a depth direction is uniformed by the ion implantation layers. Therefore, the oxidation efficiency is further improved comparing to the one-step implantation, and the thick first gate oxidation film can be formed in further short time. Moreover, an amount of impurity (argon or fluoride) taken into the first gate oxidation film will be fixed, and a film quality of the first gate oxidation film will be stabilized.

According to the present invention, a first gate oxidation film can be formed to have enough thickness compared to a second gate oxidation film by a short time process because oxidation efficiency is improved by forming an ion implantation layer of argon or hydrogen fluoride in a deep region of a surface of a semiconductor substrate before a thermal oxidation process, by executing the thermal oxidation process with covering the ion implantation layer with a gate oxidation film or by forming a plurality of the ion implantation layers having different depth by a plurality of ion implantations.

DETAILED DESCRIPTION OF THE PREFERRED EMBODIMENTS

Figure 1:
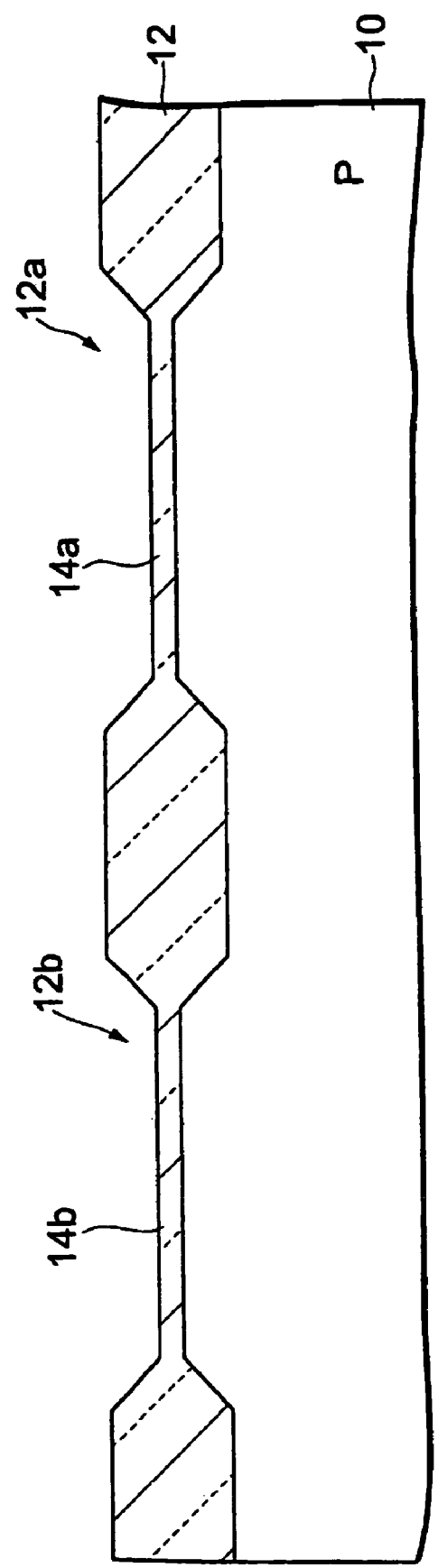
FIG. 1 is a cross sectional view showing processes up to formation of sacrificing oxidation films in a manufacturing method of a MOS-type IC according to a first embodiment of the present invention.

FIG. 1 is a cross sectional view showing processes up to formation of sacrificing oxidation films in a manufacturing method of a MOS-type IC according to a first embodiment of the present invention.

On one main surface of semiconductor substrate 10 made of, for example, a p-type silicon, a field insulating film 12 made of a silicon oxidation film having element holes 12a and 12b is formed by a well-know selecting etching process. The field insulating film 12 can be formed also by forming concave parts on the surface of the substrate by the selecting etching and thereafter forming an insulating film using chemical vapor deposition (CVD), etc. to fill up the concave parts.

Next, on surfaces of the element holes 12a and 12b, sacrificing oxidation films 14a and 14b made of silicon oxidation films are formed by a thermal oxidation process. For example, the thermal oxidation is executed in dry $O_2$ (or dry air) atmosphere at 950 degree Celsius to make thickness of the sacrificing films 14a and 14b at 40 nm. The sacrificing films 14a and 14b are formed for cleaning the surfaces of the element holes 12a and 12b by removing sticking impurities before formation of gate oxidation films; therefore, they are removed before the formation of the gate oxidation films as described later with reference to FIG. 4.

Figure 2:
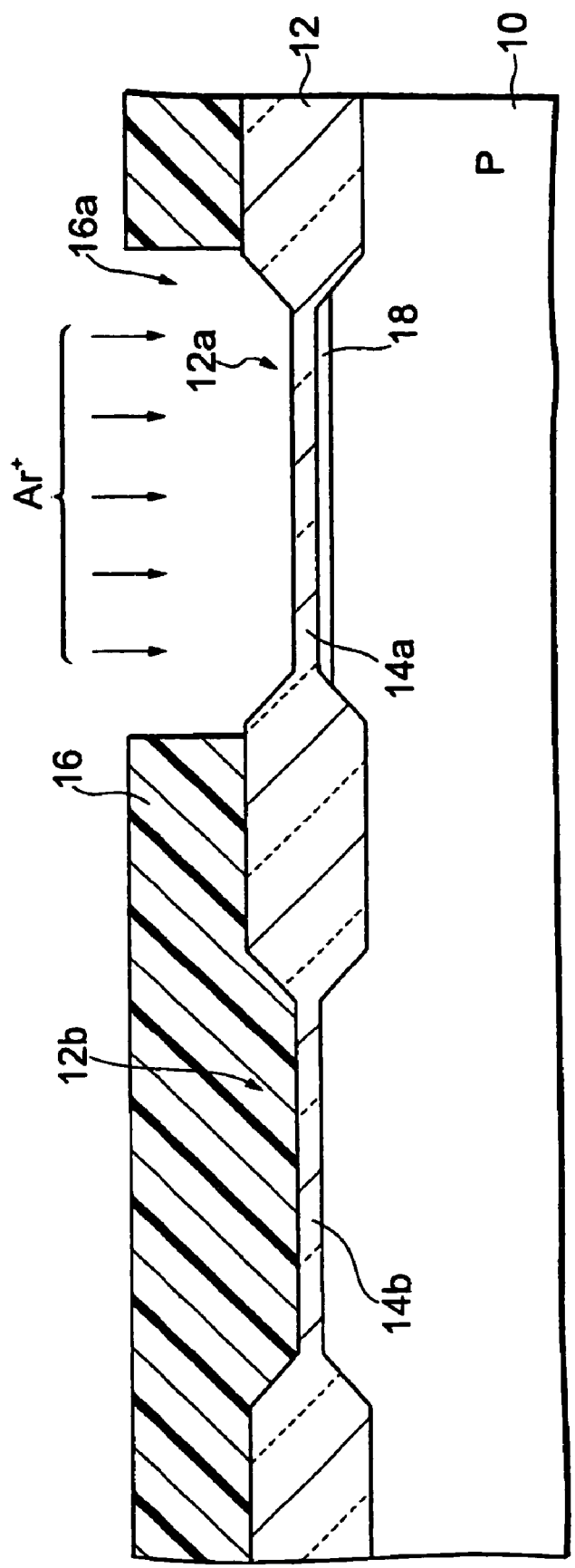
FIG. 2 is a cross sectional view showing a resist layer formation process and an ion implantation process following the processes shown in FIG. 1.

FIG. 2 is a cross sectional view showing a resist layer formation process and an ion implantation process following the processes shown in FIG. 1.

On the field insulating film 12, a resist layer 16 having a hole 16a exposing the element hole 12a is formed by a well-know photolithography process. The resist layer 16 is formed to cover the sacrificing oxidation film 14b in the element hole 12b.

Next, a selective ion implantation process with the resist layer 16 as a mask is executed to form an ion implantation layer 18 by implanting argon ion $Ar^+$ into a semiconductor part inside the element hole 12a via the hole 16a of the resist layer 16 and the sacrificing oxidation film 14a. The ion implantation is executed, for example, under a condition of accelerating voltage at 40 keV with a dose amount of $1.5\times 10^{16}$ ions/cm$^2$. A range when the argon ion is implanted to the silicon substrate at the accelerating voltage of 40 keV is 31.0 nm. The argon ion may be implanted at the accelerating voltage of 50 keV, and the range under that condition will be 49.8 nm. The ion implantation layer 18 is formed to increase oxidation velocity of the semiconductor part inside the element hole 12a.

Figure 3:
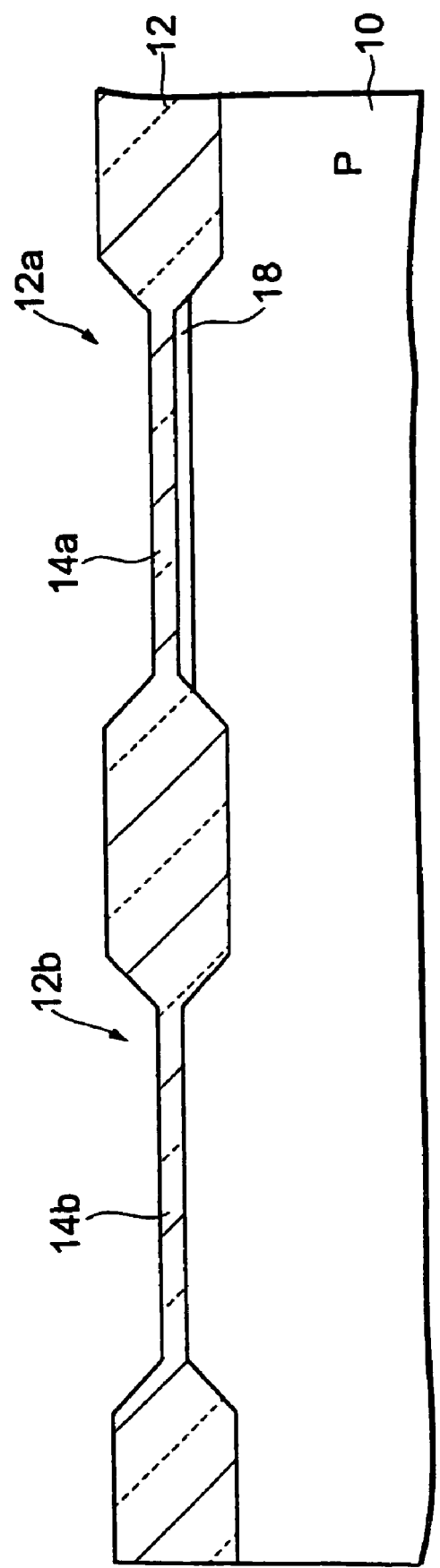
FIG. 3 is a cross sectional view showing a resist layer removing process following the processes shown in FIG. 2.

FIG. 3 is a cross sectional view showing a resist layer removing process following the processes shown in FIG. 2.

The field insulating film 12 and the sacrificing oxidation films 14a and 14b are exposed by removing the resist layer 16 by a chemical treatment. The chemical treatment may be a process using sulfuric acid and hydrogen peroxide (oxygenated water).

Figure 4:
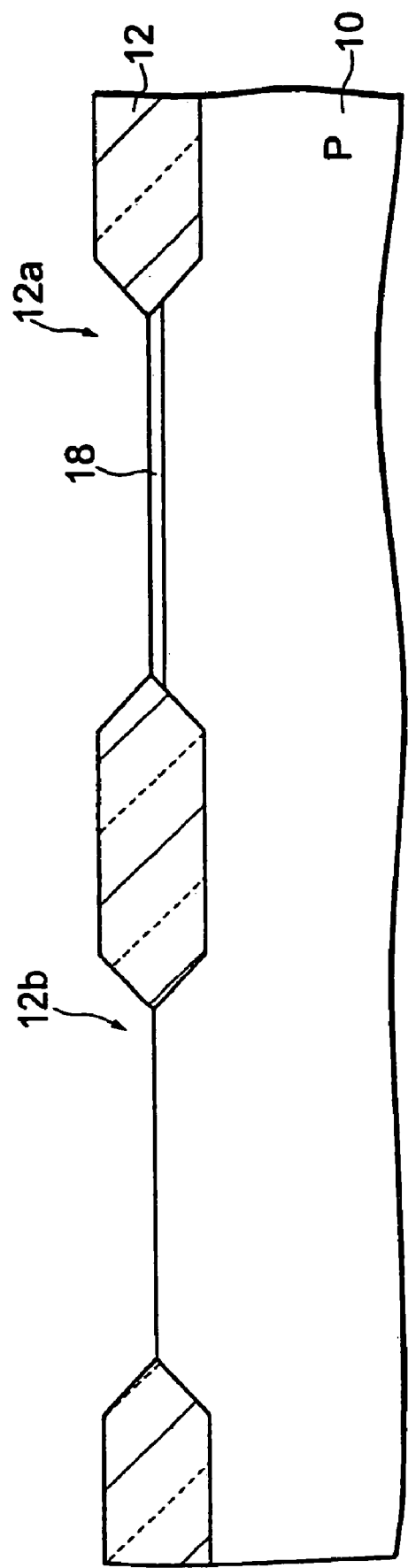
FIG. 4 is a cross sectional view showing a sacrificing film removing process following the process shown in FIG. 3.

FIG. 4 is a cross sectional view showing a sacrificing film removing process following the process shown in FIG. 3.

The semiconductor surfaces inside the element holes 12a and 12b are exposed by removing the sacrificing oxidation films 14a and 14b by a rare hydrofluoric acid treatment. The rare hydrofluoric acid treatment can be executed by using 10:1 HF for 70 seconds. Thereafter, the semiconductor surfaces inside the element holes 12a and 12b are cleaned by a cleaning process having an etching effect such as the RCA cleaning, etc. Further, the field insulating film 12 is slightly etched by the rare hydrofluoric acid treatment and the cleaning process.

Figure 5:
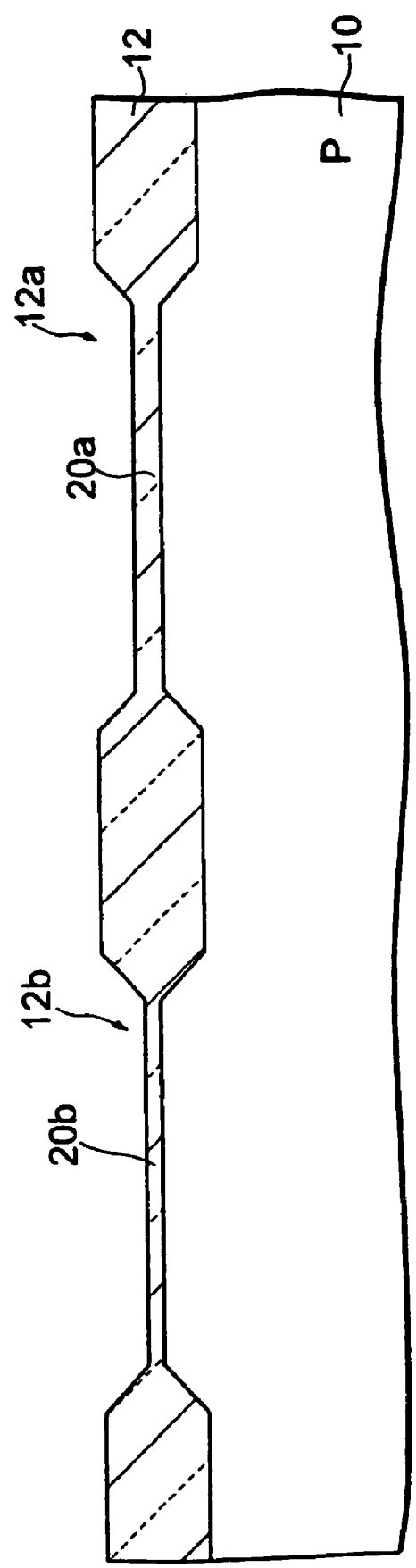
FIG. 5 is a cross sectional view showing an oxidation process following the process shown in FIG. 4.

FIG. 5 is a cross sectional view showing an oxidation process following the process shown in FIG. 4.

The gate oxidation films 20a and 10b made of silicon oxidation films are formed respectively on the semiconductor surfaces inside the element holes 12 and 12b by a thermal oxidation process. The thermal oxidation process is executed in a dry $O_2$ atmosphere at 950 degree Celsius.

The ion implantation layer 18 has been formed on the semiconductor surface of inside the element hole 12a as shown in FIG. 4; therefore, an oxidation velocity of silicon inside the element hole 12a is faster than that inside the element hole 12b. Therefore, by just one thermal oxidation process, the thick gate oxidation film 20a is formed inside the element hole 12a and simultaneously the thin gate oxidation film 20b is formed inside the element hole 12b. For example, when the ion implantation layer 18 is formed under the condition of accelerating voltage at 40 keV with a dose amount of $1.5\times 10^{16}$ ions/cm$^2$ as described in the above, the thickness of the gate oxidation film 20a will be 50 nm, and that of the gate oxidation film 20b will be 25 nm.

Figure 6:
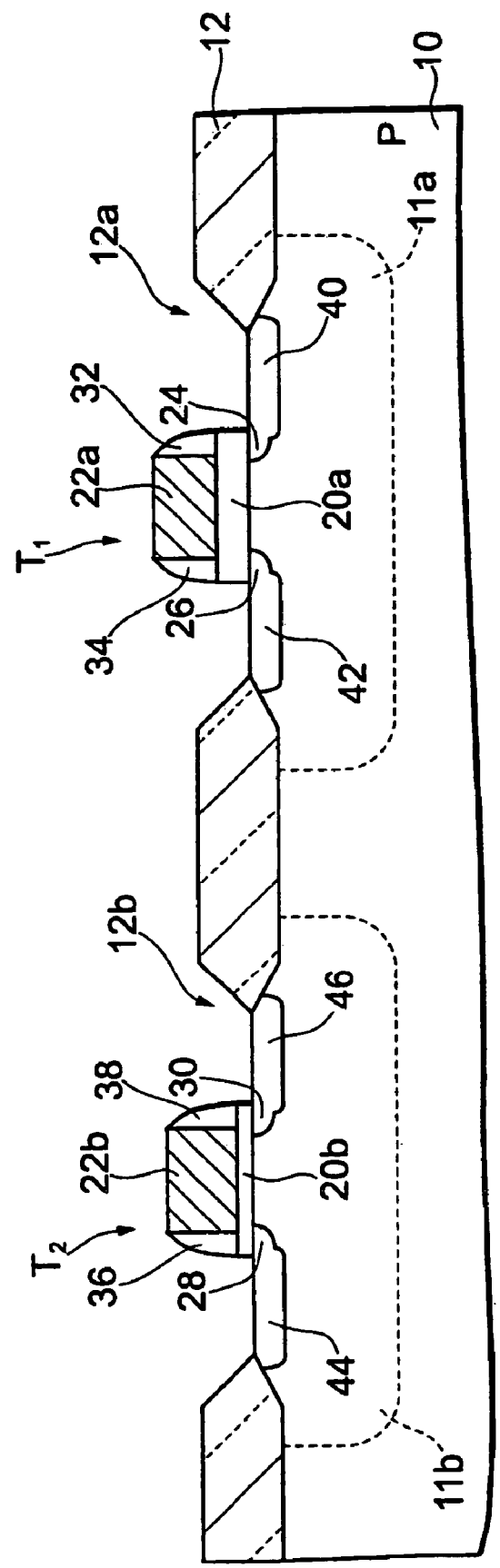
FIG. 6 is a cross sectional view showing a MOS-type transistor formation process following the process shown in FIG. 5.

FIG. 6 is a cross sectional view showing a MOS-type transistor formation process following the process shown in FIG. 5.

An n-channel MOS-type transistor $T_1$ is formed inside the element hole 12a and an n-channel MOS-type transistor $T_2$ is formed inside the element hole 12b. The transistors $T_1$ and $T_2$ are formed by respectively using the gate oxidation films 20a and 20b as a gate insulating film. Although formation of the transistor $T_1$ and $T_2$ having a light doped drain (LDD) structure is shown in FIG. 6, transistors having other structures may be formed.

After forming conducting material layer on the substrate, gate electrode layers 22a and 22b made of remaining conductive material are formed by patterning the formed conductive material layer with photolithography or dry-etching process. The conductive material is, for example, a single layer of conductive poly-silicon or a lamination layer of conductive poly-silicon and high melting point metal such as Ti, W, Mo, etc. or lamination of silicide of those metals.

Next, source regions 24 and 28 and drain regions 26 and 30 having comparatively lower density of impurity are formed by ion implantation of n-type impurity such as phosphorus, etc. with the field insulating film 12, a lamination of the gate oxidation film 20a and the gate electrode layer 22a, and a lamination of the gate oxidation film 20b and the gate electrode layer 22b as masks.

Next, a silicon oxidation film covering the gate electrode layers 22a and 22b is deposited over the silicon substrate by CVD. By etching back the deposited silicon oxidation film, side spacers 32 and 34 made of the silicon oxide remaining on one and another sides of the gate electrode layer 22a are formed, and simultaneously side spacers 36 and 38 made of the silicon oxide remaining on one and another sides of the gate electrode layer 22b are formed. The etching process at this time removes the gate oxidation films 20a and 20b to expose the regions for source and drain.

Next, source regions 40 and 44 and drain regions 42 and 46 having comparatively higher density of impurity are formed by ion implantation of n-type impurity with the field insulating film 12, a gate part including the gate oxidation film 20a, the gate electrode layer 22a, the side spacer 32 and 34, and a gate part including the gate oxidation film 20b, the gate electrode layer 22b and the side spacer 36 and 38 as masks. Thereafter, according to a normal structuring method of IC, formation of an interlayer insulating film, formation of connecting holes to the interlayer insulating film, wiring to each connecting hole, etc. will be executed.

P-channel MOS transistors may be formed as the transistors $T_1$ and $T_2$ by reversing conductive types of the substrate, source and drain. Moreover, a p-type well region 11a and an n-type well region 11b may be formed before the formation of the field insulating film 12 at the process shown in FIG. 1, and an n-channel transistor $T_1$ and a p-channel transistor $T_2$ may be formed respectively in the well regions 11a and 11b. In that case, the well regions 11a and 11b may be n-type and p-type, and the transistors $T_1$ and $T_2$ may be p-type and n-type.

Although the gate insulating films 20a and 20b of each of the transistors T1 and T2 shown in FIG. 6 are formed with a single layer of a gate oxidation film, they may be made of a laminated layer. For example, a lamination of the gate oxidation film 20a (or 20b) and at least one of a silicon nitride film, a silicon oxynitiride film, a tantalum oxide film and a high dielectric constant film, or a sandwich lamination wherein a CVD silicon oxidation film is laminated over the gate oxidation film 20a (or 20b) via a silicon nitride film or a silicon oxynitiride film may be used.

The inventor of the present invention has experimented upon an effect of the argon ion implantation over the oxidation of silicon. In that experiment, wafers No.1 to No.10 each made of a p-type silicon substrate were prepared, and as shown in the following Table 1 argon ion $Ar^+$ was implanted at accelerating voltage of 40 keV with different doses to the No.2 to No.10 wafers and then the thermal process was executed to the No.1 to No.10 wafers. Thereafter, thickness of an oxidation film of each wafer was measured and increased value of the thickness compared to the No.1 wafer was measured for each of the wafers No.2 to No.10. The Table 1 shows a dose of $Ar^+$, oxidation film thickness and increased value of the thickness for each of the wafers No.1 to No.10.

TABLE 1

| WAFER NO. | $Ar^+$ DOSE [ions/cm$^2$] | INCREASED IN FILM THICKNESS [nm] | OXIDATION FILM THICNESS [nm] |
|---|---|---|---|
| 1 | 0 | 0 | 15.1 |
| 2 | $1.00 \times 10^{13}$ | 0.22 | 15.36 |
| 3 | $1.00 \times 10^{14}$ | 0.33 | 15.63 |
| 4 | $7.00 \times 10^{14}$ | 1.5 | 16.51 |
| 5 | $1.00 \times 10^{15}$ | 2.58 | 17.72 |
| 6 | $4.00 \times 10^{15}$ | 6.1 | 21.2 |
| 7 | $8.00 \times 10^{15}$ | 12.5 | 27.6 |
| 8 | $1.00 \times 10^{16}$ | 15.6 | 30.7 |
| 9 | $1.20 \times 10^{16}$ | 19.8 | 34.9 |
| 10 | $2.00 \times 10^{16}$ | 29.5 | 44.68 |

Figure 7:
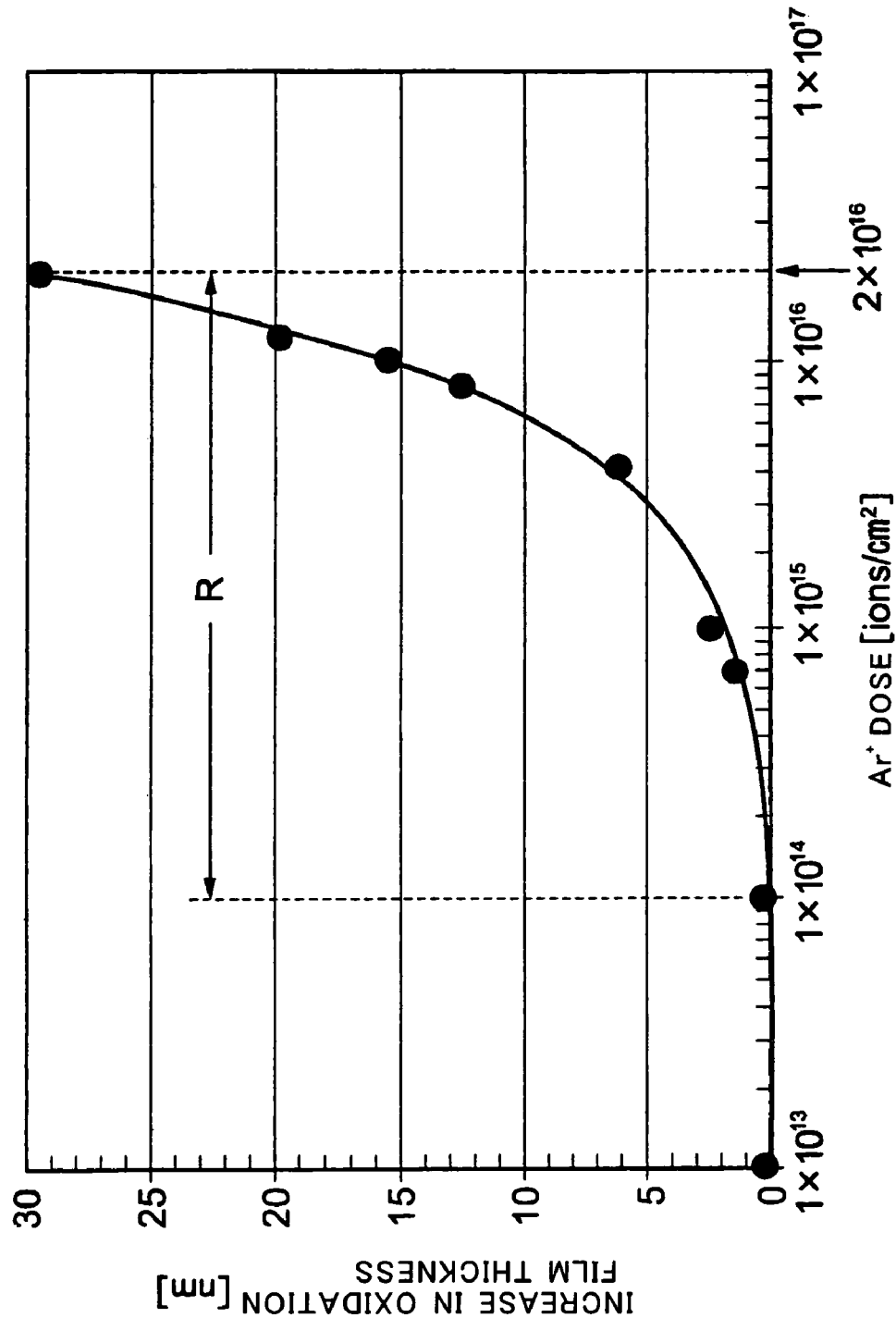
FIG. 7 is a graph showing a relationship between a dose amount of argon ion and increase in thickness of the oxidation film.

FIG. 7 is a graph showing a relationship between a dose amount of argon ion and increase in thickness of the oxidation film according to the data shown in Table 1. Increase in the thickness of the oxidation films can be recognized in a range R where the dose of argon ion $Ar^+$ is from $1 \times 10^{14}$ to $2 \times 10^{16}$ ions/cm$^2$.

The ion implantation process shown in FIG. 2 may be executed under a condition of the accelerating voltage at 20-50 keV and dose $1 \times 10^{14}$ to $2 \times 10^{16}$ ions/cm$^2$ (preferably the accelerating voltage at 20-45 keV and dose $6 \times 10^{14}$ to $1 \times 10^{15}$ ions/cm$^2$). Moreover, instead of argon ion, fluoride ion may be implanted at the accelerating voltage of 15-25 keV with dose of $6 \times 10^{14}$ to $1 \times 10^{15}$ ions/cm$^2$, and thereafter similar processes as shown in FIG. 3 to FIG. 6 may be executed. If the accelerating voltages of the implantation of argon ion and fluoride ion are respectively set not higher than 20 keV and 15 keV, density of the implanted ion will be decreased by out-diffusion and it makes difficult to obtain enough oxidation velocity. Furthermore, if the accelerating voltages of the implantation of argon ion and fluoride ion are respectively set higher than 50 keV and 25 keV, ion implantation depth will be deeper and it causes increase in leak voltage because of increase in crystalline defects in the substrate.

The inventor of the present invention has experimented upon oxidation of silicon for comparing a case that the ion implantation was executed by one step with a case that the ion implantation was executed by two steps. In this comparison experiment, No.0 wafer made of a p-type silicon substrate was defined as a standard wafer, and no ion implantation was executed to the No.0 wafer. The one-step ion implantation was executed to No.11 to No.14 wafers each made of a p-type silicon substrate at accelerating voltage of 40 keV with dose amount shown in the following Table 2.

TABLE 2

| WAFER NO. | $Ar^+$ DOSE [ions/cm$^2$] |
|---|---|
| 11 | $1 \times 10^{14}$ |
| 12 | $1 \times 10^{15}$ |
| 13 | $4 \times 10^{15}$ |
| 14 | $8 \times 10^{15}$ |

On the other hand, the two-step ion implantation was executed to No.21 to No.24 wafers each made of a p-type silicon substrate at accelerating voltage of 60 keV at the first step for deeper implantation and 20 keV at the second step for shallower implantation with dose amount shown in the following Table 3.

TABLE 3

| WAFER NO. | Ar+ DOSE[ions/cm²] at 1st STEP | Ar+ DOSE[ions/cm²] at 2nd STEP |
|---|---|---|
| 21 | $5 \times 10^{13}$ | $5 \times 10^{13}$ |
| 22 | $5 \times 10^{14}$ | $5 \times 10^{14}$ |
| 23 | $2 \times 10^{15}$ | $2 \times 10^{15}$ |
| 24 | $4 \times 10^{15}$ | $4 \times 10^{15}$ |

The total amount of the doses at the first step and the second step for each of the wafers No.21 to No.24 shown in the Table 3 respectively equals to the amount of the dose for each of the wafers No.11 to No.14 shown in the Table 2. In other words, the amount of the dose implanted in the one-step implantation is divided in two portions that are implanted to the different depth in the two-step implantation.

Next, thermal oxidation process was executed to the wafers No.0, No.11 to No14 and No.21 to No.24 under the same oxidation condition. Thereafter, thickness of an oxidation film of each of the wafers No.11 to No14 and No.21 to No.24 was measured and increased value (difference) of the thickness compared to the thickness of the No.0 wafer (15.1 nm) was measured for each of the wafers No.2 to No.10. The following Table 4 shows Ar+ dose and increase in the thickness of the oxidation film for each of the wafers No.11 to No14 and No.21 to No.24. Regarding to the wafers No.21 to No.24, the total amount of the dose at the first and the second steps is shown.

TABLE 4

| Ar+ DOSE [ions/cm²] | WAFER NO. | INCREASED IN FILM THICKNESS IN ONE-STEP IMPLANTATION [nm] | WAFER NO. | INCREASED IN FILM THICKNESS IN TWO-STEP IMPLANTATION [nm] |
|---|---|---|---|---|
| $1.00 \times 10^{14}$ | 11 | 0.33 | 21 | 0.54 |
| $1.00 \times 10^{15}$ | 12 | 2.58 | 22 | 2.83 |
| $4.00 \times 10^{15}$ | 13 | 6.1 | 23 | 9.5 |
| $8.00 \times 10^{15}$ | 14 | 12.5 | 24 | 14.5 |

Figure 8:
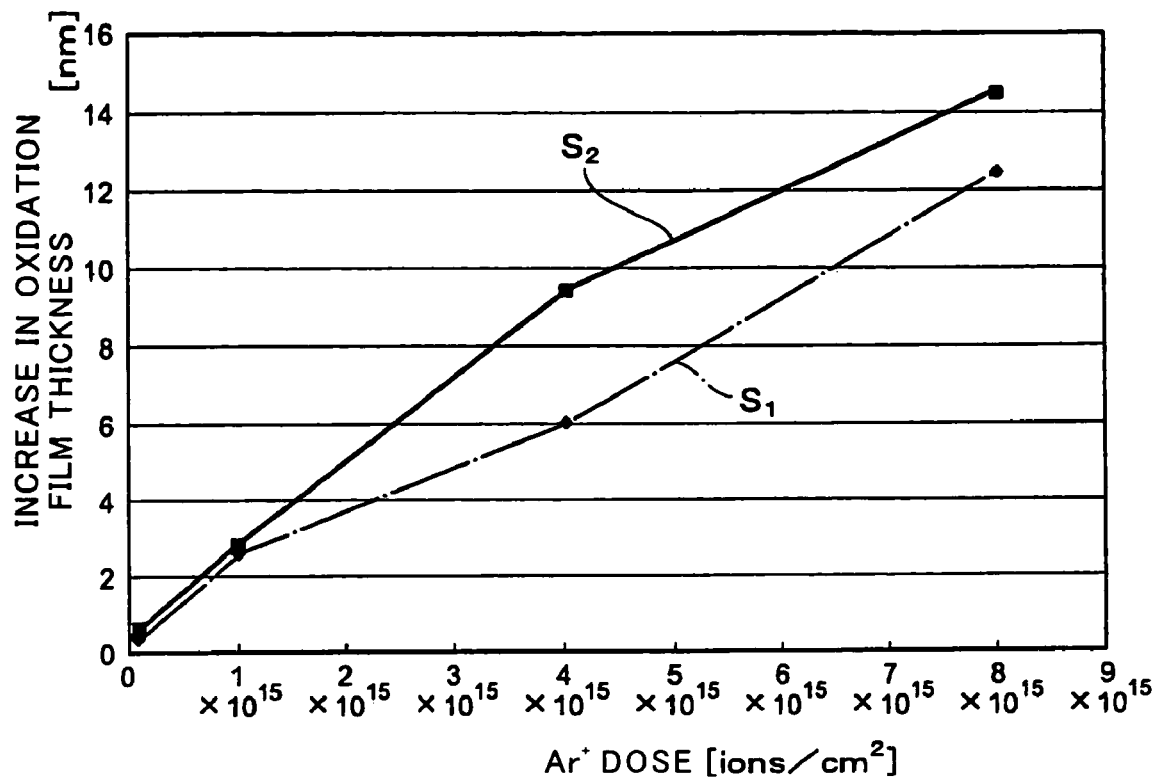
FIG. 8 is a graph showing a relationship between a dose amount of argon ion and increase in thickness of the oxidation film in a case of two-step implantation.

FIG. 8 is a graph showing a relationship between a dose amount of argon ion and increase in thickness of the oxidation film in a case of two-step implantation based on the data shown in the Table 4. In the graph, a line $S_1$ represents the data in the one-step implantation, and a line $S_2$ represents the data in the two-step implantation. As shown in FIG. 8, oxidation velocity in the two-step implantation is faster than that in the one-step implantation because the increase in the film thickness in the two-step implantation is higher than that in the one-step implantation. The reason for that the two-step implantation has faster oxidation velocity is considered that density distribution of implanted ion in the two-step implantation in a depth direction is uniformed as compared to Gauss distribution in the one-step implantation.

Figure 9:
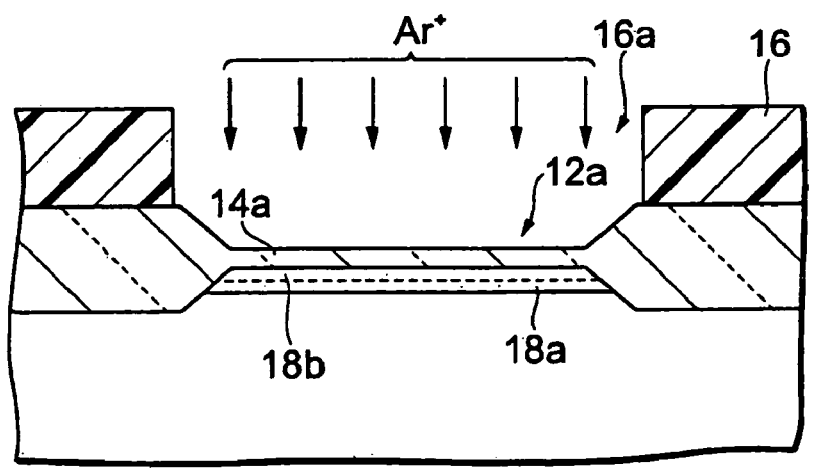
FIG. 9 is a cross sectional view showing formation of the ion implantation layer formed by the process shown in FIG. 2 with the two-step implantation.

FIG. 9 is a cross sectional view showing formation of the ion implantation layer formed by the process shown in FIG. 2 with the two-step implantation shown in the Tables 3 and 4 and FIG. 8 instead of applying the one-step implantation. The same reference numbers represent the similar parts as in FIG. 2, and their detailed description will be omitted.

In the ion implantation process shown in FIG. 9, for example, a comparatively deep ion implantation layer 18a is formed by implanting argon ion Ar+ at accelerating voltage of 60 keV with dose amount of $2 \times 10^{15}$ ions/cm² to the semiconductor part inside the element hole 12a at the first step, and a comparatively shallow ion implantation layer 18b is formed by implanting argon ion Ar+ at accelerating voltage of 20 keV with dose amount of $2 \times 10^{15}$ ions/cm² to the semiconductor part inside the element hole 12a at the second step. The ion implantation process in this case may be executed under a condition of the accelerating voltage at 50-100 keV and dose $5 \times 10^{13}$ to $5 \times 10^{15}$ ions/cm² (preferably the accelerating voltage at 60-80 keV and dose $5 \times 10^{14}$ to $4 \times 10^{15}$ ions/cm²) at the first step and under a condition of the accelerating voltage at 10-40 keV and dose $5 \times 10^{13}$ to $5 \times 10^{15}$ ions/cm² (preferably the accelerating voltage at 20-30 keV and dose $5 \times 10^{14}$ to $4 \times 10^{15}$ ions/cm²) at the second step. After the ion implantation process, the processes shown in FIG. 3 to FIG. 6 are executed.

Moreover, instead of argon ion, fluoride ion F+ may be implanted in the first and the second steps to form the ion implantation layers 18a and 18b instead of implanting the argon ion. In this case, the fluoride ion F+ is implanted under a condition of the accelerating voltage at 30-60 keV and dose $5 \times 10^{13}$ to $5 \times 10^{15}$ ions/cm² (preferably the accelerating voltage at 40-50 keV and dose $5 \times 10^{14}$ to $4 \times 10^{15}$ ions/cm²) at the first step and under a condition of the accelerating voltage at 10-25 keV and dose $5 \times 10^{13}$ to $5 \times 10^{15}$ ions/cm² (preferably the accelerating voltage at 15-20 keV and dose $5 \times 10^{14}$ to $4 \times 10^{15}$ ions/cm²) at the second step. After the ion plantation process, the processes shown in FIG. 3 to FIG. 6 are executed.

Thickness of the gate oxidation film 20a formed to be thick by implanting the argon or fluoride ion can be set to 35-70 nm (preferably 45-60 nm, and more preferably 50 nm) in the thermal oxidation process shown in FIG. 5. Further, thickness of the gate oxidation film 20b formed to be thin without implanting the argon or fluoride ion can be set to 6.5-35 nm (preferably 12-20 nm, and more preferably 15 nm) in the thermal oxidation process shown in FIG. 5.

Although two types of the gate oxidation films are formed by setting the dose of the implanted ion to two values in the above-described embodiment, tree types of ate oxidation films may be formed by setting the dose of the implanted ion to three values.

According to the first embodiment of the present invention, the ion implantation layer 18 or 18a is formed by the ion implantation process shown in FIG. 2 under one of the conditions that the argon ion is implanted at accelerating voltage of 20-50 keV with dose of $1 \times 10^{14}$ to $2 \times 10^{16}$ ions/cm², that the fluoride ion is implanted at the accelerating voltage of 15-25 keV with dose of $6 \times 10^{14}$ to $1 \times 10^{15}$ ions/cm², and that the argon or fluoride ion is implanted by two steps; therefore, the ion implantation layers 18 or 18a is formed comparatively deeper region from the surface of the silicon substrate. By that, when the cleaning having the etching effect is performed in the cleaning process shown in FIG. 4, the ion implantation layer 18 or 18a will not be removed by the etching effect because they are formed comparatively deeper region from the surface of the silicon substrate. Thereafter, when the thermal oxidation process shown in FIG. 5 is executed, the implanted ion is slight diffused to an out direction; however, the ion in the comparatively deeper region from the surface of the silicon is hardly diffused and decrease in the ion density as a whole is a little. Therefore, the oxidation efficiency in the element hole 12a is improved, and the gate oxidation film 20a can be thicker enough than the gate oxidation film 20b by the short-time process. Especially, when the argon or fluoride ion is implanted by the two-step implantation as described with reference to FIG. 9, the oxidation efficiency inside the element hole 12a will be further increased, and the thick gate oxidation film 20a can be formed faster.

When the argon ion is implanted by the ion implantation process shown in FIG. 2, the argon ion implantation layer 18 or 18a is formed in the relatively deep region from the silicon surface; therefore, in the thermal oxidation process shown in FIG. 5, the silicon surface region inside the element hole 12a is converted to a denuded zone (DZ). Therefore, in the process shown in FIG. 6, the high quality transistor $T_1$ can be formed in the silicon surface region having small defection in the element hole 12a.

When the fluoride ion is implanted by the ion implantation process shown in FIG. 2, the fluoride ion implantation layer 18 or 18a is formed in the relatively deep region from the silicon surface; therefore, in the various thermal processes after the formation of the transistor $T_1$ shown in FIG. 6, diffusions of the conductive type defining impurity such as phosphorus, etc in the source regions 24 and 40 and the drain regions 26 and 42 are restrained and transistor property can be stabilized. Moreover, in the thermal oxidation process in FIG. 5, fluoride is taken into the gate oxidation film 20a from the ion implantation layer 18 or 18a; therefore, hot carrier tolerance and insulating resistance capacity of the gate oxidation film 20a will be improved.

When the argon or the fluoride ion is implanted by two steps in the ion implantation process shown in FIG. 2, uniformity of the implanted ion density distribution in the silicon substrate is improved by the ion implantation layers 18a and 18b; therefore, an amount of impurity (argon or fluoride) taken into the gate oxidation film 20a at the time of the thermal oxidation process in FIG. 5 will be fixed, and a film quality of the gate oxidation film 20a will be stabilized.

FIG. 10 to FIG. 15 show a manufacturing method of a MOS-type IC according to a second embodiment of the present invention. In FIG. 10 to FIG. 15, the same reference numbers as in FIG. 1 to FIG. 5 represents the similar parts as in FIG. 1 to FIG. 5, and the detailed description thereof will be omitted.

Figure 10:
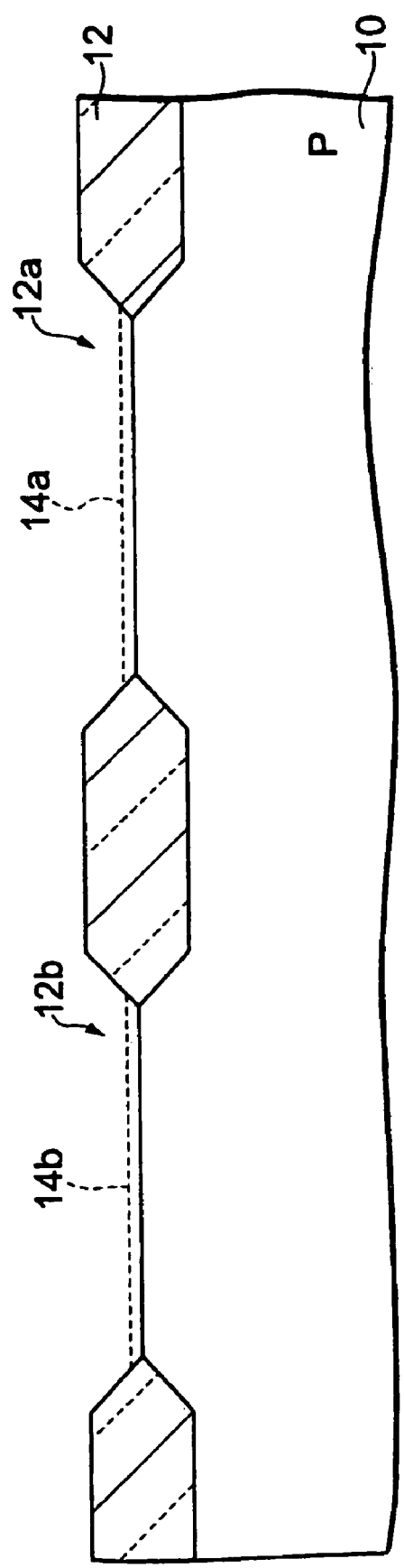
FIG. 10 is a cross sectional view showing processes up to formation of sacrificing oxidation films in a manufacturing method of a MOS-type IC according to a second embodiment of the present invention.

FIG. 10 is a cross sectional view showing processes up to formation of sacrificing oxidation films in a manufacturing method of a MOS-type IC according to the second embodiment of the present invention.

In the process shown in FIG. 10, the field insulating film 12 having the element holes 12a and 12b is formed on one main surface of the semiconductor substrate (p-type silicon substrate) 10 as same as the above-described process shown in FIG. 1. Then, as described above with reference to FIG. 1, the sacrificing oxidation films 14a and 14b are formed on the semiconductor surfaces inside the element holes 12a and 12b, and thereafter, the sacrificing oxidation films 14a and 14b are removed as described above with reference to FIG. 4. Then the cleaning process having the etching effect is executed to the removal surface. As a result, the semiconductor surfaces in side the element holes 12a and 12b are cleaned.

Figure 11:
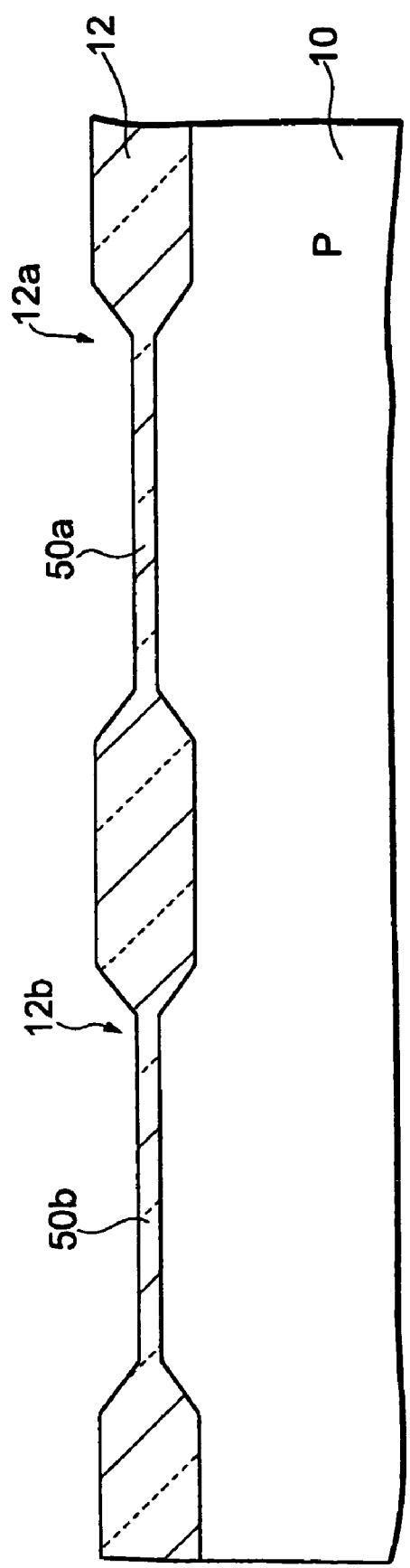
FIG. 11 is a cross sectional view showing an oxidation process following the processes shown in FIG. 10.

FIG. 11 is a cross sectional view showing an oxidation process following the processes shown in FIG. 10.

In the process shown in FIG. 11, gate oxidation films 50a and 50b made of silicon oxidation films are formed on the semiconductor surfaces inside the element holes 12a and 12b by a thermal oxidation process. The thermal oxidation process is executed in a dry $O_2$ atmosphere at 950 degrees Celsius, and thickness of both gate oxidation films 50a and 50b can be 25 nm.

Figure 12:
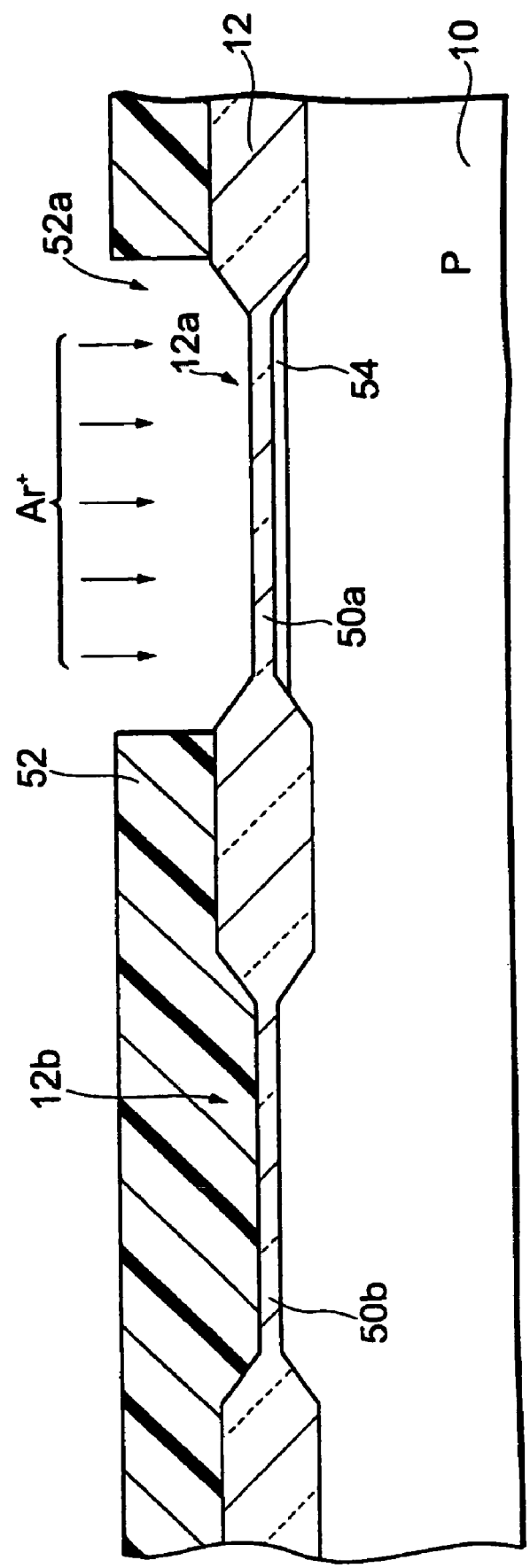
FIG. 12 is a cross sectional view showing a resist layer formation process and an ion implantation process following the process shown in FIG. 11.

FIG. 12 is a cross sectional view showing a resist layer formation process and an ion implantation process following the process shown in FIG. 11.

In the process shown in FIG. 12, a resist layer 52 having a hole 52a exposing the element hole 12a is formed on the field insulating film 12 by the well-known photolithography process. The resist layer 52 is formed to cover the gate oxidation film 50b in the element hole 12b.

Next, a selective ion implantation process with the resist layer 52 as a mask is executed to form an ion implantation layer 54 by implanting argon ion $Ar^+$ into a semiconductor part inside the element hole 12a via the hole 52a of the resist layer 52 and the sacrificing oxidation film 50a. The ion implantation is executed, for example, under a condition of accelerating voltage at 20-50 keV with a dose amount of $1 \times 10^{14}$-$2 \times 10^{16}$ ions/cm$^2$ (preferably accelerating voltage at 20-45 keV with a dose amount of $6 \times 10^{15}$-$1 \times 10^{16}$ ions/cm$^2$). Moreover, instead of argon ion, fluoride ion may be implanted at the accelerating voltage of 15-25 keV with dose of $6 \times 10^{14}$ to $1 \times 10^{15}$ ions/cm$^2$ for forming the ion implantation layer 54.

In the ion implantation process shown in FIG. 12, the ion implantation layer 54 having a relatively deep implantation layer and a relatively shallow implantation layer can be formed by implanting argon ion or fluoride ion by the two-step implantation process as described before with reference to FIG. 9. In case of forming the ion implantation layer 54 by implanting the argon ion, for example, the argon ion is implanted under a condition of accelerating voltage at 50-100 keV and dose $5 \times 10^{13}$ to $5 \times 10^{15}$ ions/cm$^2$ (preferably the accelerating voltage at 60-80 keV and dose $5 \times 10^{14}$ to $4 \times 10^{15}$ ions/cm$^2$) at the first step and under a condition of the accelerating voltage at 10-40 keV and dose $5 \times 10^{13}$ to $5 \times 10^{15}$ ions/cm$^2$ (preferably the accelerating voltage at 20-30 keV and dose $5 \times 10^{14}$ to $4 \times 10^{15}$ ions/cm$^2$) at the second step. Moreover, instead of argon ion, fluoride ion $F^+$ may be implanted. In this case, the fluoride ion $F^+$ is implanted under a condition of the accelerating voltage at 30-60 keV and dose $5 \times 10^{13}$ to $5 \times 10^{15}$ ions/cm$^2$ (preferably the accelerating voltage at 40-50 keV and dose $5 \times 10^{14}$ to $4 \times 10^{15}$ ions/cm$^2$) at the first step and under a condition of the accelerating voltage at 10-25 keV and dose $5 \times 10^{13}$ to $5 \times 10^{15}$ ions/cm$^2$ (preferably the accelerating voltage at 15-20 keV and dose $5 \times 10^{14}$ to $4 \times 10^{15}$ ions/cm$^2$) at the first step.

Figure 13:
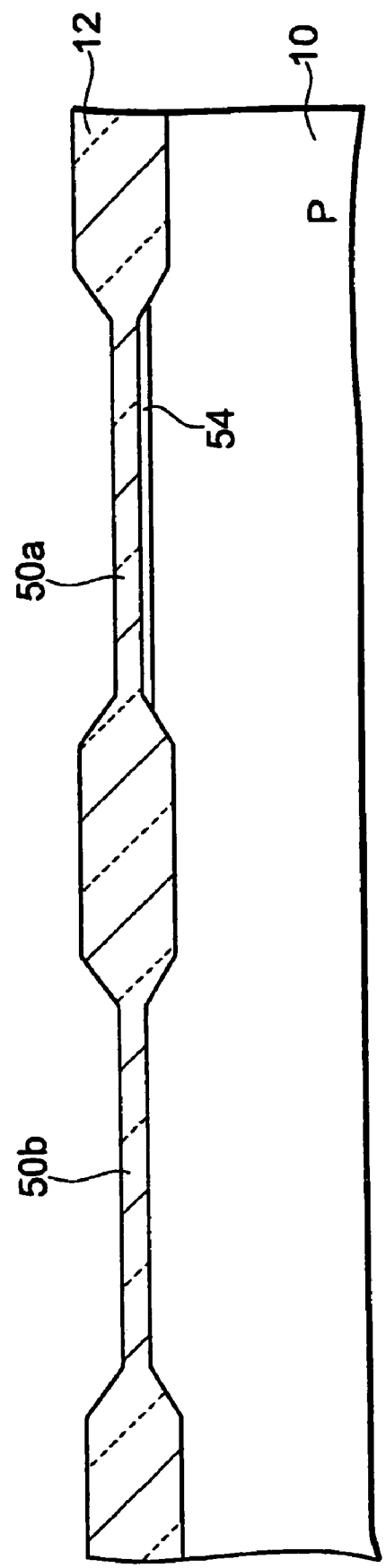
FIG. 13 is a cross sectional view showing a resist layer removing process following the processes shown in FIG. 12.

FIG. 13 is a cross sectional view showing a resist layer removing process following the processes shown in FIG. 12.

In the process shown in FIG. 12, the resist layer 52 is removed by the similar process as described before with reference to FIG. 3.

Figure 14:
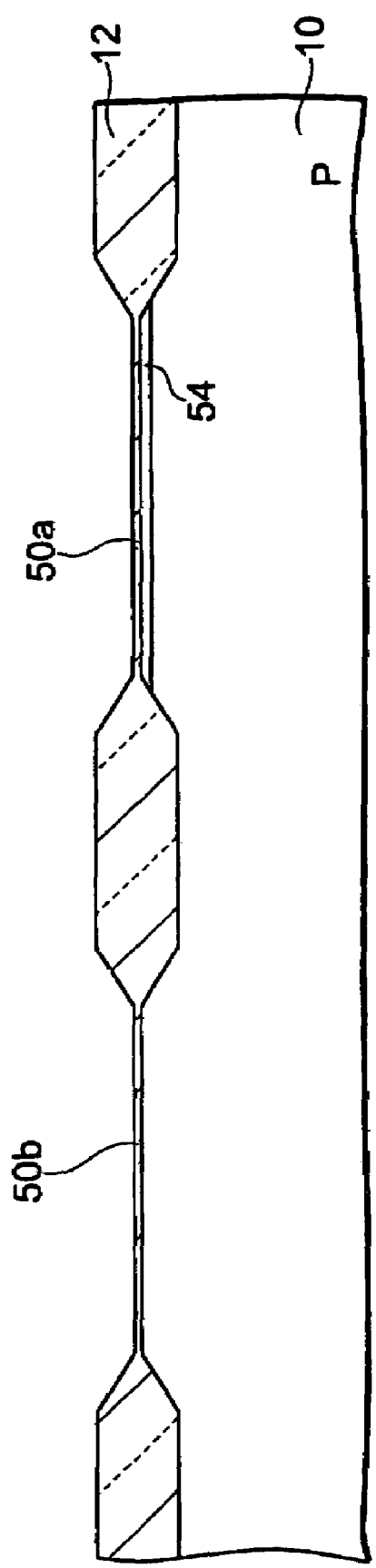
FIG. 14 is a cross sectional view showing an oxidation film cleaning process following the process shown in FIG. 13.

FIG. 14 is a cross sectional view showing an oxidation film cleaning process following the process shown in FIG. 13.

In the process shown in FIG. 14, the gate oxidation films 50a and 50b are thinned by the cleaning process having the etching effect. Etch amounts of the gate oxidation films 54a and 54b are both 2 nm. For the cleaning process, a process using ammonium, hydrogen peroxide (oxygenated water) and HF (200:1 HF) can be executed. The cleaning process is executed for obtaining a clean surface of the gate oxidation films 50a and 50b by removing polluted impurities caused by sticking or removing (immersion to an resist removal tank) of the resist layer 52. Further, the field insulating film 12 is slightly etched by the cleaning process.

Figure 15:
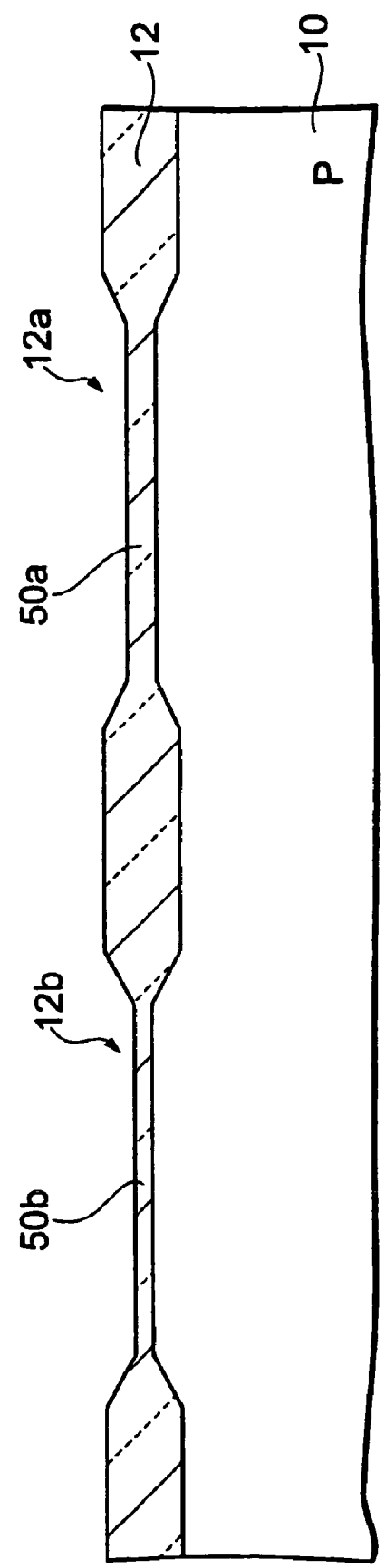
FIG. 15 is a cross sectional view showing an oxidation process following the process shown in FIG. 14.
Figure 16:
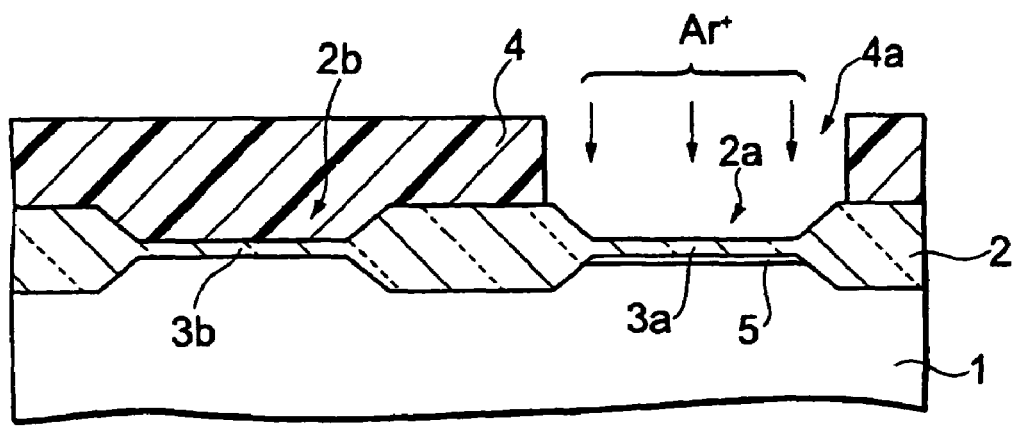
FIG. 16 is a cross sectional view showing an ion implantation process in a manufacturing method of gate oxidation films according to the prior art.
Figure 17:
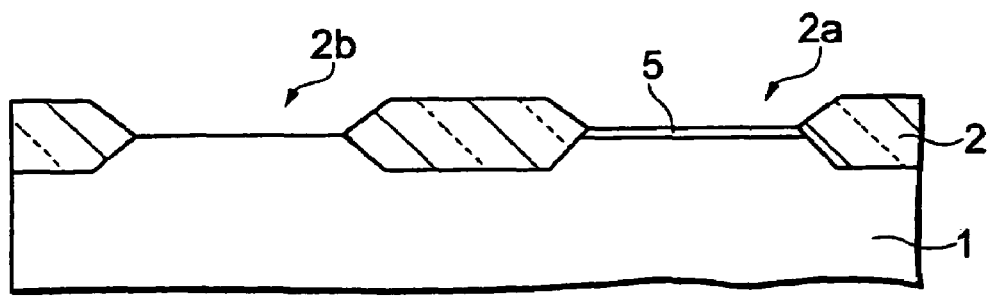
FIG. 17 is a cross sectional view showing a resist layer removing process and a sacrificing oxidation film removing process following the process shown in FIG. 16.
Figure 18:
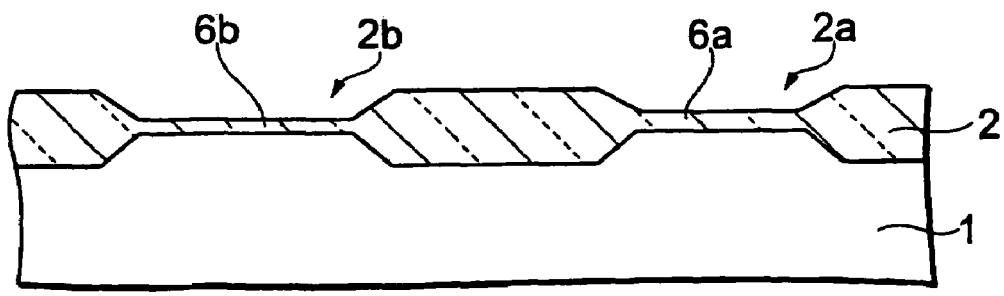
FIG. 18 is a cross sectional view showing an oxidation process following the processes shown in FIG. 17.

FIG. 15 is a cross sectional view showing an oxidation process following the process shown in FIG. 14.

In the process shown in FIG. 15, the gate oxidation films 50a and 50b are thickened by a thermal oxidation process in a dry $O_2$ atmosphere at 950 degrees Celsius. Because the ion implantation layer 54 has been formed on the semiconductor surface inside the element hole 12a as shown in FIG. 14, the oxidation velocity of the silicon inside the element hole 12a is faster than that inside the element hole 12b. Therefore, by just one thermal oxidation process, the thick gate oxidation film 50a is formed inside the element hole 12a and simultaneously the thin gate oxidation film 50b is formed inside the element hole 12b. For example, the thickness of the gate oxidation film 50a will be 35-70 nm (preferably 45-60 nm, and more preferably 50 nm). Further, thickness of the gate oxidation film 50b formed to be thin will be 6.5-35 nm (preferably 12-20 nm, and more preferably 15 nm).

After the process shown in FIG. 15, the MOS-type transistors having the gate oxidation films 50a and 50b as gate insulating films can be formed inside the element holes 12a and 12b as similar to the process described before with reference to FIG. 6. Moreover, as described above with reference to FIG. 6, the gate insulating films 50a and 50b of each of the transistors T1 and T2 may be made of a laminated layer. Although two types of the gate oxidation films are formed by setting the dose of the implanted ion to two values in the above-described second embodiment, tree types of ate oxidation films may be formed by setting the dose of the implanted ion to three values.

According to the second embodiment of the present invention described with reference to FIG. 10 to FIG. 15, after the formation of the ion implantation layer 54 by implanting impurities that increases oxidation velocity but does not define conductive type such as argon or fluoride, etc. at the process shown in FIG. 12, the ion implantation layer 54 is treated by the thermal oxidation process with being covered by the thinned gate oxidation film 50a; therefore, the gate oxidation film 50a becomes thick and effectively restrains out-diffusion of the implanted ion from the ion implantation layer 54. Therefore, the oxidation velocity inside the element hole 12a is improved, and the thickness of the gate oxidation film 50a can be thicker than that of the gate oxidation film 50b by the shorter process. Especially as described before with reference to FIG. 9, when the argon or fluoride ion is implanted by the two-step implantation, the oxidation efficiency inside the element hole 12a will be further improved and the thick gate oxidation film 50a can be formed much faster.

When the argon ion is implanted by the ion implantation process shown in FIG. 12, as similar to the above described with reference to FIGS. 5 and 6, the high quality transistor can be formed in the silicon surface region having small defection in the element hole 12a. Moreover, when the fluoride ion is implanted by the ion implantation process shown in FIG. 12, as similar to the above described with reference to FIG. 5 and FIG. 6, hot carrier tolerance and insulating resistance capacity of the gate oxidation film 50a will be improved, and a property of the MOS-type transistor will be stabilized. Further, when the argon or the fluoride ion is implanted by two steps in the ion implantation process shown in FIG. 12, uniformity of the implanted ion density distribution in the silicon substrate is improved by the ion implantation layer 54 consisted of the deep and shallow ion implantation layers; therefore, an amount of impurity (argon or fluoride) taken into the gate oxidation film 50a at the time of the thermal oxidation process in FIG. 15 will be fixed, and a film quality of the gate oxidation film 50a will be stabilized.

The present invention has been described in connection with the preferred embodiments. The invention is not limited only to the above embodiments. It is apparent that various modifications, improvements, combinations, and the like can be made by those skilled in the art.

What are claimed are:

1. A method of manufacturing gate oxidation films, comprising the steps of:
    (a) preparing a semiconductor substrate;
    (b) forming a field insulating film having a first and a second element holes on one main surface of the semiconductor substrate;
    (c) forming a first and a second sacrificing oxidation films respectively on semiconductor surfaces inside the first and the second element holes by a first thermal oxidation process;
    (d) forming a resist layer exposing the first element hole and covering the second element hole on the field insulating film;
    (e) forming an ion implantation layer by implanting argon ion in to a semiconductor part inside the first element hole via the first sacrificing oxidation film with the resist layer as a mask under a condition of accelerating voltage more than 20 keV and up to about 50 keV and a dose amount of $1 \times 10^{14}$ to $2 \times 10^{16}$ ions/cm$^2$;
    (f) removing the resist layer after forming the ion implantation layer;
    (g) removing the first and the second sacrificing oxidation films after removing the resist layer; and
    (h) forming a first and a second gate oxidation films on semiconductor surfaces respectively in the first and the second element holes by a second thermal process after removing the first and the second sacrificing oxidation films, wherein the first gate oxidation film is formed to be thicker than the second gate oxidation film by accelerated oxidation based on the ion implantation layer.

2. A method of manufacturing gate oxidation films, comprising the steps of:
    (a) preparing a semiconductor substrate;
    (b) forming a field insulating film having a first and a second element holes on one main surface of the semiconductor substrate;
    (c) forming a first and a second sacrificing oxidation films respectively on semiconductor surfaces inside the first and the second element holes by a first thermal oxidation process;
    (d) forming a resist layer exposing the first element hole and covering the second element hole on the field insulating film;
    (e) forming an ion implantation layer by implanting fluoride ion in to a semiconductor part inside the first element hole via the first sacrificing oxidation film with the resist layer as a mask under a condition of accelerating voltage more than 15 keV and up to about 25 keV and a dose amount of $6 \times 10^{14}$ to $1 \times 10^{15}$ ions/cm$^2$;
    (f) removing the resist layer after forming the ion implantation layer;
    (g) removing the first and the second sacrificing oxidation films after removing the resist layer; and
    (h) forming a first and a second gate oxidation films on semiconductor surfaces respectively in the first and the second element holes by a second thermal process after removing the first and the second sacrificing oxidation films, wherein the first gate oxidation film is formed to be thicker than the second gate oxidation film by accelerated oxidation based on the ion implantation layer.

3. A method of manufacturing gate oxidation films, comprising the steps of:
(a) preparing a semiconductor substrate;
(b) forming a field insulating film having a first and a second element holes on one main surface of the semiconductor substrate;
(c) forming a first and a second gate oxidation films respectively on semiconductor surfaces inside the first and the second element holes by a first thermal oxidation process;
(d) forming a resist layer exposing the first element hole and covering the second element hole on the field insulating film;
(e) forming an ion implantation layer by implanting an impurity ion that increases oxidation velocity but does not define a conductive type to a semiconductor part inside the first element hole via the first gate oxidation film with the resist layer as a mask;
(f) removing the resist layer after forming the ion implantation layer;
(g) thinning, but not completely removing, the first and the second gate oxidation films by an etching process after removing the resist layer; and
(h) thickening the first and the second gate oxidation films by a second thermal process after thinning the first and the second gate oxidation films, wherein the first gate oxidation film is thickened more than the second gate oxidation film by accelerated oxidation based on the ion implantation layer.

4. The method of manufacturing gate oxidation films according to claim 3, wherein the ion implanting step (e) implants argon ion as the impurity ion under a condition of accelerating voltage at 20 to 50 keV and a dose amount of $1 \times 10^{14}$ to $2 \times 10^{16}$ ions/cm$^2$.

5. The method of manufacturing gate oxidation films according to claim 3, wherein the ion implanting step (e) implants fluoride ion as the impurity ion under a condition of accelerating voltage at 15 to 25 keV and a dose amount of $6 \times 10^{14}$ to $1 \times 10^{16}$ ions/cm$^2$.

6. A method of manufacturing gate oxidation films, comprising the steps of:
(a) preparing a semiconductor substrate;
(b) forming a field insulating film having a first and a second element holes on one main surface of the semiconductor substrate;
(c) forming a first and a second sacrificing oxidation films respectively on semiconductor surfaces inside the first and the second element holes by a first thermal oxidation process;
(d) forming a resist layer exposing the first element hole and covering the second element hole on the field insulating film;
(e) forming a plurality of ion implantation layers by a plurality of ion implantation, each implanting an impurity ion that increases oxidation velocity but does not define a conductive type to a semiconductor part inside the first element hole via the first sacrificing oxidation film with the resist layer as a mask at accelerating voltage different from one another;
(f) removing the resist layer after forming the ion implantation layers;
(g) removing the first and the second sacrificing oxidation films after removing the resist layer; and
(h) forming a first and a second gate oxidation films on semiconductor surfaces respectively in the first and the second element holes by a second thermal process after removing the first and the second sacrificing oxidation films, wherein the first gate oxidation film is formed to be thicker than the second gate oxidation film by accelerated oxidation based on the ion implantation layer.

7. The method of manufacturing gate oxidation films according to claim 6, wherein the ion implanting step (e) implants argon ion as the impurity ion by two steps wherein a first step is executed under a condition of accelerating voltage at 50 to 100 keV and a dose amount of $5 \times 10^{13}$ to $5 \times 10^{15}$ ions/cm$^2$, and a second step is executed under a condition of accelerating voltage at 10 to 40 keV and a dose amount of $5 \times 10^{13}$ to $5 \times 10^{15}$ ions/cm$^2$.

8. The method of manufacturing gate oxidation films according to claim 6, wherein the ion implanting step (e) implants fluoride ion as the impurity ion by two steps wherein a first step is executed under a condition of accelerating voltage at 30 to 60 keV and a dose amount of $5 \times 10^{13}$ to $5 \times 10^{15}$ ions/cm$^2$, and a second step is executed under a condition of accelerating voltage at 10 to 25 keV and a dose amount of $5 \times 10^{13}$ to $5 \times 10^{15}$ ions/cm$^2$.

9. A method of manufacturing gate oxidation films, comprising the steps of:
(a) preparing a semiconductor substrate;
(b) forming a field insulating film having a first and a second element holes on one main surface of the semiconductor substrate;
(c) forming a first and a second gate oxidation films respectively on semiconductor surfaces inside the first and the second element holes by a first thermal oxidation process;
(d) forming a resist layer exposing the first element hole and covering the second element hole on the field insulating film;
(e) forming a plurality of ion implantation layers by a plurality of ion implantation, each implanting an impurity ion that increases oxidation velocity but does not define a conductive type to a semiconductor part inside the first element hole via the first gate oxidation film with the resist layer as a mask at accelerating voltage different from one another;
(f) removing the resist layer after forming the ion implantation layers;
(g) thinning the first and the second gate oxidation films by an etching process after removing the resist layer; and
(h) thickening the first and the second gate oxidation films by a second thermal process after thinning the first and the second gate oxidation films, wherein the first gate oxidation film is thickened more than the second gate oxidation film by accelerated oxidation based on the ion implantation layer.

10. The method of manufacturing gate oxidation films according to claim 9, wherein the ion implanting step (e) implants argon ion as the impurity ion by two steps wherein a first step is executed under a condition of accelerating voltage at 50 to 100 keV and a dose amount of $5 \times 10^{13}$ to $5 \times 10^{15}$ ions/cm$^2$, and a second step is executed under a condition of accelerating voltage at 10 to 40 keV and a dose amount of $5 \times 10^{13}$ to $5 \times 10^{15}$ ions/cm$^2$.

11. The method of manufacturing gate oxidation films according to claim 9, wherein the ion implanting step (e) implants fluoride ion as the impurity ion by two steps wherein a first step is executed under a condition of accelerating voltage at 30 to 60 keV and a dose amount of $5 \times 10^{13}$ to $5 \times 10^{15}$ ions/cm$^2$, and a second step is executed under a condition of accelerating voltage at 10 to 25 keV and a dose amount of $5 \times 10^{13}$ to $5 \times 10^{15}$ ions/cm$^2$.

* * * * *